(12) United States Patent
Huang et al.

(10) Patent No.: US 7,446,585 B2
(45) Date of Patent: Nov. 4, 2008

(54) PROGRAMMABLE DELAY CIRCUIT

(75) Inventors: Hong-Yi Huang, Taipei (TW);
Shiun-Dian Jan, Taipei County (TW);
Yuan-Hua Chu, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 21 days.

(21) Appl. No.: 11/738,523

(22) Filed: Apr. 23, 2007

(65) Prior Publication Data

US 2008/0143413 A1 Jun. 19, 2008

(30) Foreign Application Priority Data

Dec. 15, 2006 (TW) .............................. 95147028 A

(51) Int. Cl.
*H03H 11/26* (2006.01)
(52) U.S. Cl. ..................... 327/290; 327/231; 327/258; 327/259; 327/261; 327/284; 327/269
(58) Field of Classification Search ................ 327/231, 327/258, 259, 261, 284, 269, 290
See application file for complete search history.

(56) References Cited

U.S. PATENT DOCUMENTS 6,456,137 B1 * 9/2002 Asao .......................... 327/290

OTHER PUBLICATIONS

Article titled "All Digital Pulsewidth Control Loop With Real Time Output" jointly authored by Huang et al., 17th VLSI Design/ CAD Symposium, Aug. 8-11, 2006.
Article titled "All Digital Pulsewidth Control Loop Using Two-Step Delay Element" jointly authored by Huang et al., The International Technical Conference on Circuits/ Systems, Computers and communicatins, Proceedings vol. 3, p. 685-p. 688, Jul. 10-13, 2006, Chiang Mai, Thailand.
Article titled "Differential Bidirectional Transceiver for On-chip Long Wires" jointly authored by Huang et al., The International Technical Conference on Circuits/ Systems, Computers and communicatins, Proceedings vol. 3, p. 773-p. 776, Jul. 10-13, 2006, Chiang Mai, Thailand.

* cited by examiner

*Primary Examiner*—Kenneth B. Wells
*Assistant Examiner*—Brandon S Cole
(74) *Attorney, Agent, or Firm*—Jianq Chyun IP Office

(57) ABSTRACT

A programmable delay circuit including a first inverter, a second inverter, a variable resistance unit, and a variable capacitance unit is provided. The first inverter receives a positive-phase received signal, and transmits an anti-phase output signal through an anti-phase output signal line. The second inverter receives an anti-phase received signal, and transmits a positive-phase output signal through a positive-phase output signal line. The variable resistance unit regulates an equivalent resistance between the anti-phase output signal line and the positive-phase output signal line according to M bits in a delay-controlled code. The variable capacitance unit regulates an equivalent capacitance between the anti-phase output signal line and the positive-phase output signal line according to N bits in the delay-controlled code.

18 Claims, 16 Drawing Sheets

//PROGRAMMABLE DELAY CIRCUIT

CROSS-REFERENCE TO RELATED APPLICATION

This application claims the priority benefit of Taiwan application serial no. 95147028, filed Dec. 15, 2006. All disclosure of the Taiwan application is incorporated herein by reference.

BACKGROUND OF THE INVENTION

1. Field of the Invention

The present invention relates to a programmable delay circuit. More precisely, the present invention relates to a programmable delay circuit that regulates delay time with a variable resistance unit and a variable capacitance unit.

2. Description of Related Art

Programmable delay circuits are indispensable components of many integrated circuits. For example, delay-locked loops, data transmission interfaces, and various circuits for phase comparison must use the programmable delay circuits. Therefore, it is the goal of many research institutes to design a programmable delay circuit with powerful functions.

FIG. 1 is a schematic structural view of a conventional programmable delay circuit. Referring to FIG. 1, the conventional programmable delay circuit 100 is mainly formed by coupling inverters 101 and 102, and the delay time between an input signal $V_{IN1}$ and an output signal $V_{OUT1}$ is determined by the driving capability of the inverter 101. The conventional programmable delay circuit 100 uses a delay-controlled code b[K:1] to control an ON/OFF states of PMOS transistors $MP_{11}$-$MP_{1K}$ and NMOS transistors $MN_{11}$-$MN_{1K}$, so as to regulate a current $I_1$ flowing through the inverter 101, where K is a positive integer. Thus, along with the change of current $I_1$, the delay time between the input signal $V_{IN1}$ and the output signal $V_{OUT1}$ changes accordingly.

However, with reference to a simulation diagram of the conventional delay circuit 100 of FIG. 2, it can be known according to a characteristic curve of the delay-controlled code to the delay time that the linearity of the delay time controlled by the conventional delay circuit 100 is very poor, and the range of regulation is quite narrow. In addition, the conventional delay circuit 100 requires a relatively large layout area to accommodate the PMOS transistors $MP_{11}$-$MP_{1K}$ and the NMOS transistors $MN_{11}$-$MN_{1K}$.

FIG. 3 is a schematic structural view of another conventional programmable delay circuit. Referring to FIG. 3, a conventional programmable delay circuit 300 is also mainly formed by coupling inverters 302 and 302, and the delay time between an input signal $V_{IN3}$ and an output signal $V_{OUT3}$ is also determined by the driving capability of the inverter 301. Here, PMOS transistors $MP_{31}$-$MP_{3L}$ and NMOS transistors $MN_{31}$-$MN_{35}$ constitute a digital control current mirror, in which L is a positive integer. The digital-controlled current mirror regulates a current I3 flowing through the inverter 301 according to a delay-controlled code b[L:1], so as to achieve the purpose of regulating the delay time.

When a delay-controlled code b[L:1] is at a high level, in order to make the programmable delay circuit 300 operate normally, the digital-controlled current mirror must include a small-sized PMOS transistor $MP_{35}$, so as to provide a micro current $I_3$ to the inverter 301. However, the micro current $I_3$ will influence the maximum delay time and the minimum delay time that can be provided by the conventional programmable delay circuit 300. In addition, with reference to a simulation diagram of the conventional programmable delay circuit 300 of FIG. 4, it can be known that the i range of corner overlap of the delay time controlled by the conventional programmable delay circuit 300 is wider, but the curve is still non-linear.

FIG. 5 is a schematic structural view of still another conventional programmable delay circuit. Referring to FIG. 5, a conventional programmable delay circuit 500 is mainly formed by coupling inverters 501 and 502, and the delay time between an input signal $V_{IN5}$ and an output signal $V_{OUT5}$ is determined by the equivalent capacitance on the output end of the inverter 501. Here, the conventional programmable delay circuit 500 uses a delay-controlled code b[S:1] to control the ON/OFF states of NMOS transistors $MN_{51}$-$MN_{5S}$, so as to regulate the influence of load capacitors $C_{51}$-$C_{5S}$ on the output end of the inverter 501.

However, in order to prevent the delay effect formed by the parasitic resistance of the NMOS transistors $NM_{51}$-$NM_{5S}$ and the load capacitors $C_{51}$-$C_{5S}$, the width of the NMOS transistors $NM_{51}$-$NM_{5S}$ and the size of the load capacitors $C_{51}$-$C_{5S}$ for the conventional programmable delay circuit 500 must be increased to achieve the optimal design. In addition, with reference to a simulation diagram of the conventional programmable delay circuit 500 of FIG. 6, it is known that the range of corner overlap of the delay time controlled by conventional programmable delay circuit 500 is very narrow.

SUMMARY OF THE INVENTION

The present invention is directed to a programmable delay circuit capable of regulating delay time through a variable resistance unit and a variable capacitance unit.

The present invention is also directed to a programmable delay circuit capable of regulating delay time through a plurality of variable resistance devices and a plurality of variable capacitance devices.

A programmable delay circuit including a first inverter, a second inverter, a variable resistance unit, and a variable capacitance unit is provided. The programmable delay circuit is used to delay a received differential signal according to a delay-controlled code to obtain a differential output signal. The received differential signal includes a positive-phase received signal and an anti-phase received signal, and the differential output signal includes a positive-phase output signal and an anti-phase output signal, and a resolution of the delay-controlled code is (M+N) bits, wherein M and N are integers. During the regulation of delay time, the first inverter receives the positive-phase received signal, so as to transmit the anti-phase output signal through an anti-phase output signal line. The second inverter receives the anti-phase received signal, so as to transmit the positive-phase output signal through a positive-phase output signal line.

The programmable delay circuit regulates delay time between the received differential signal and the differential output signal by changing an equivalent resistance and an equivalent capacitance between the anti-phase output signal line and the positive-phase output signal line. The variable resistance unit regulates the equivalent resistance between the anti-phase output signal line and the positive-phase output signal line according to M bits in the delay-controlled code. The variable capacitance unit regulates the equivalent capacitance between the anti-phase output signal line and the positive-phase output signal line according to N bits in the delay-controlled code.

In another aspect of the present invention, a programmable delay circuit including a first inverter, a second inverter, a plurality of variable resistance devices, and a plurality of variable capacitance devices is provided. The programmable delay circuit is used to delay a received differential signal according to a delay-controlled code, so as to obtain a differential output signal. The received differential signal includes a positive-phase received signal and an anti-phase received signal, the differential output signal includes a positive-phase output signal and an anti-phase output signal, and a resolution of the delay-controlled code is (M+N) bits, wherein M and N are integers. During the regulation of delay time, the first inverter receives the positive-phase received signal to generate the anti-phase output signal. The second inverter receives the anti-phase received signal to generate the positive-phase output signal.

The programmable delay circuit regulates delay time between the received differential signal and the differential output signal by changing an equivalent resistance and an equivalent capacitance between the output ends of the first inverter and the second inverter The plurality of variable resistance devices regulates the equivalent resistance between the output ends of the first inverter and the second inverter according to M bits in the delay-controlled code. The plurality of variable capacitance devices regulates the equivalent capacitance between the output ends of the first inverter and the second inverter according to N bits in the delay-controlled code.

The present invention uses the architecture that regulates the delay time through the variable resistance unit and the variable capacitance unit, so that the programmable delay circuit of the present invention has a high yield and smaller layout area. In addition, the delay time regulated by the programmable delay circuit of the present invention is more precise and flexible as compared to the conventional programmable delay circuits in terms of the linearity and the regulation range.

In order to make the aforementioned and other objects, features and advantages of the present invention comprehensible, embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
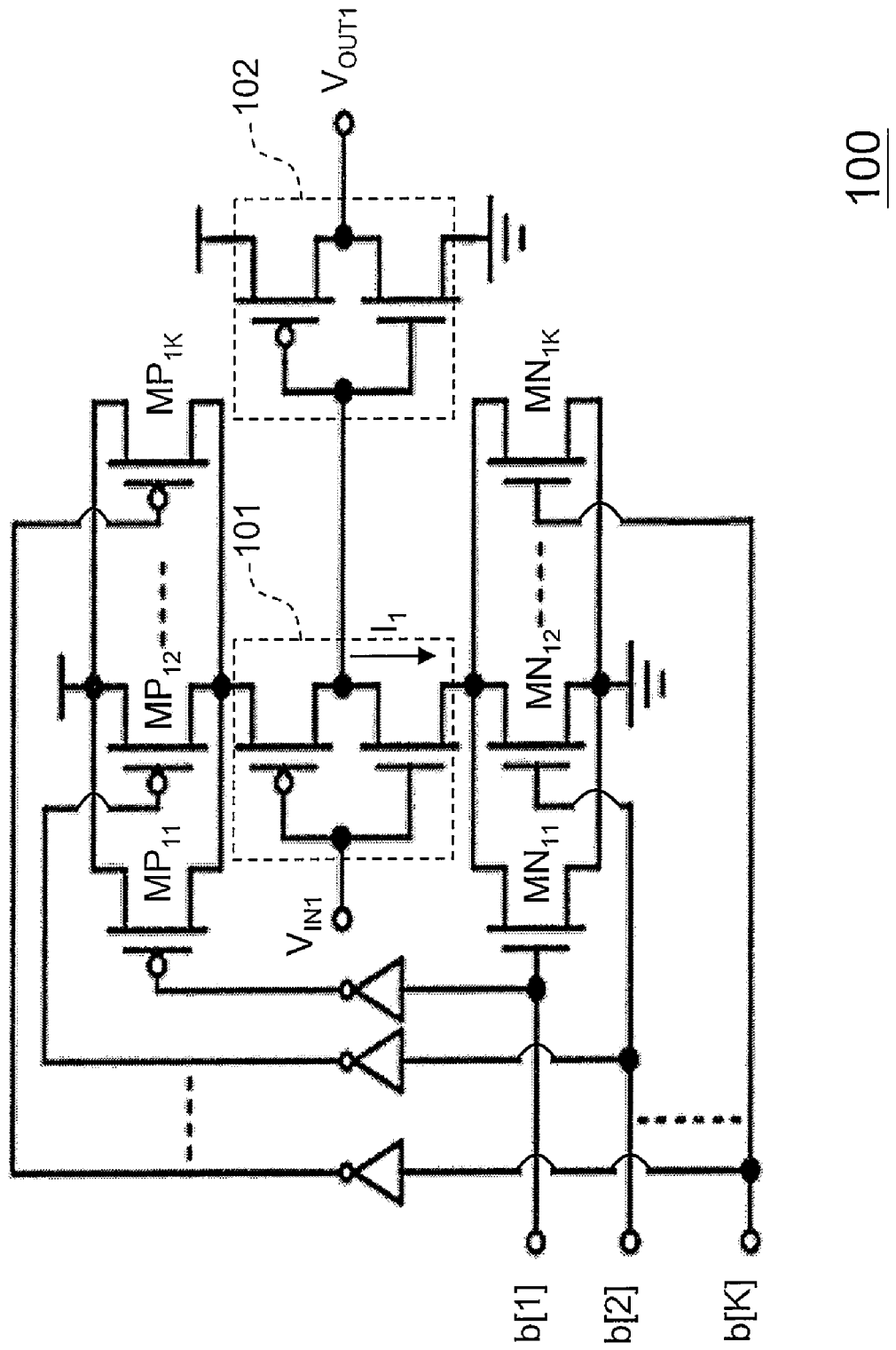
FIG. 1 is a schematic structural view of a conventional programmable delay circuit.
Figure 2:
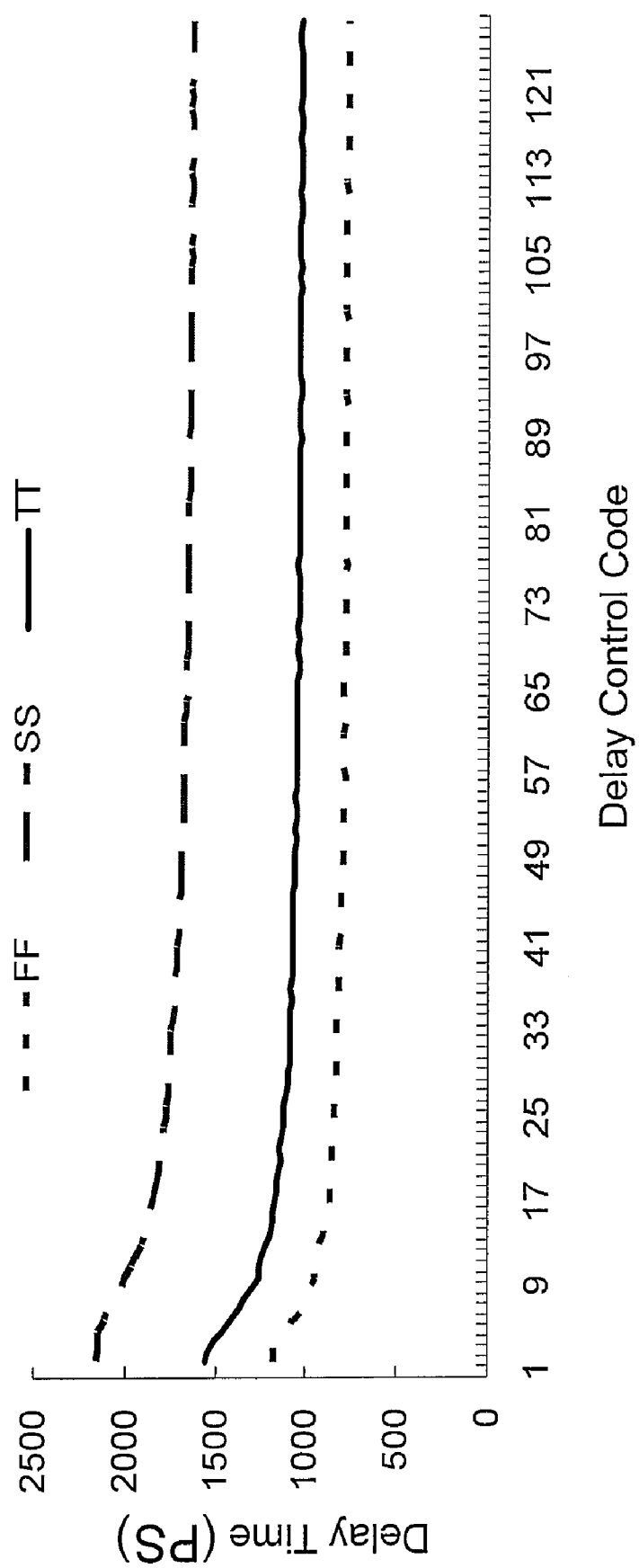
FIG. 2 is a simulation diagram of the conventional programmable delay circuit 100.
Figure 3:
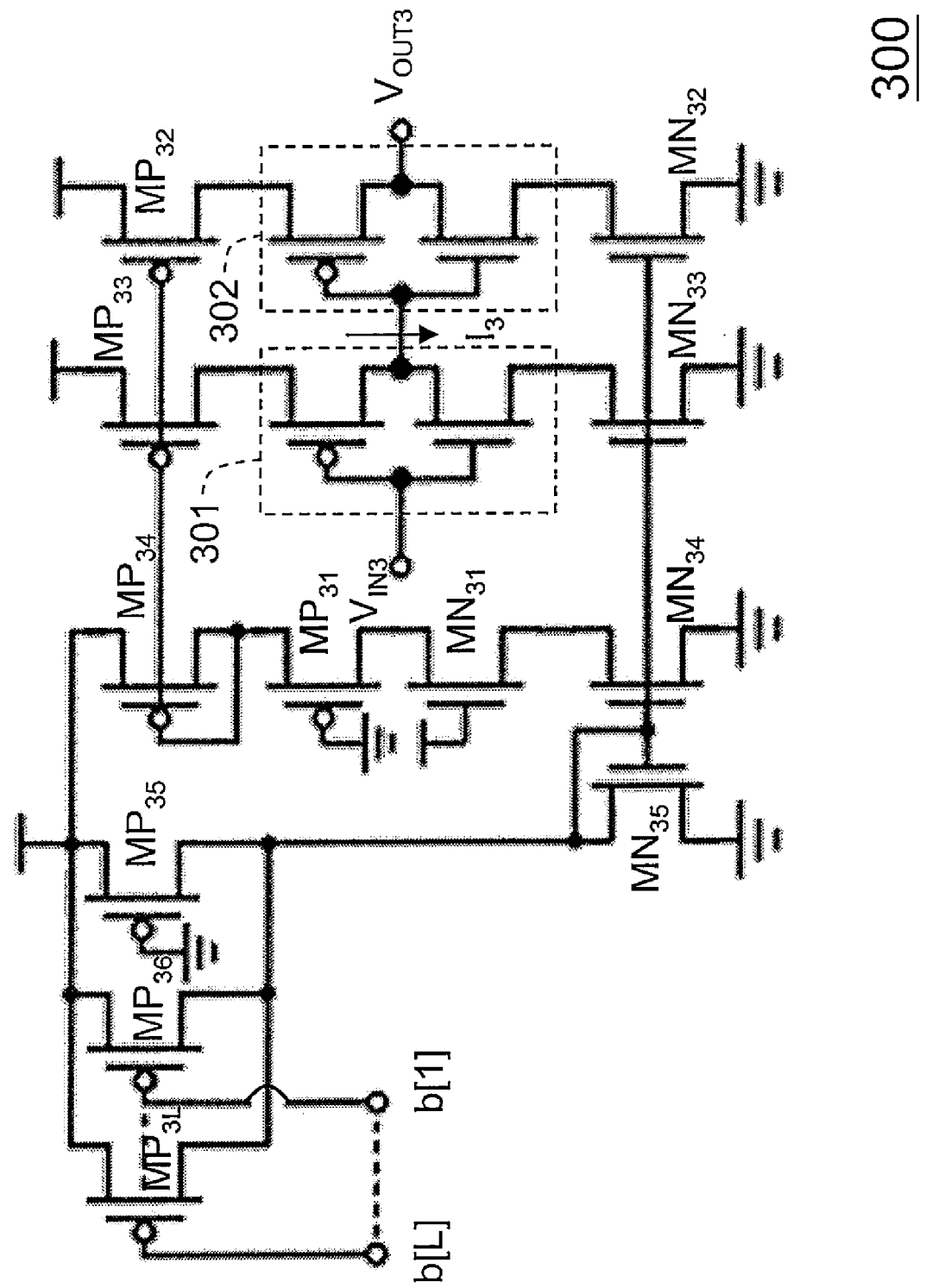
FIG. 3 is a schematic structural view of another conventional programmable delay circuit.
Figure 4:
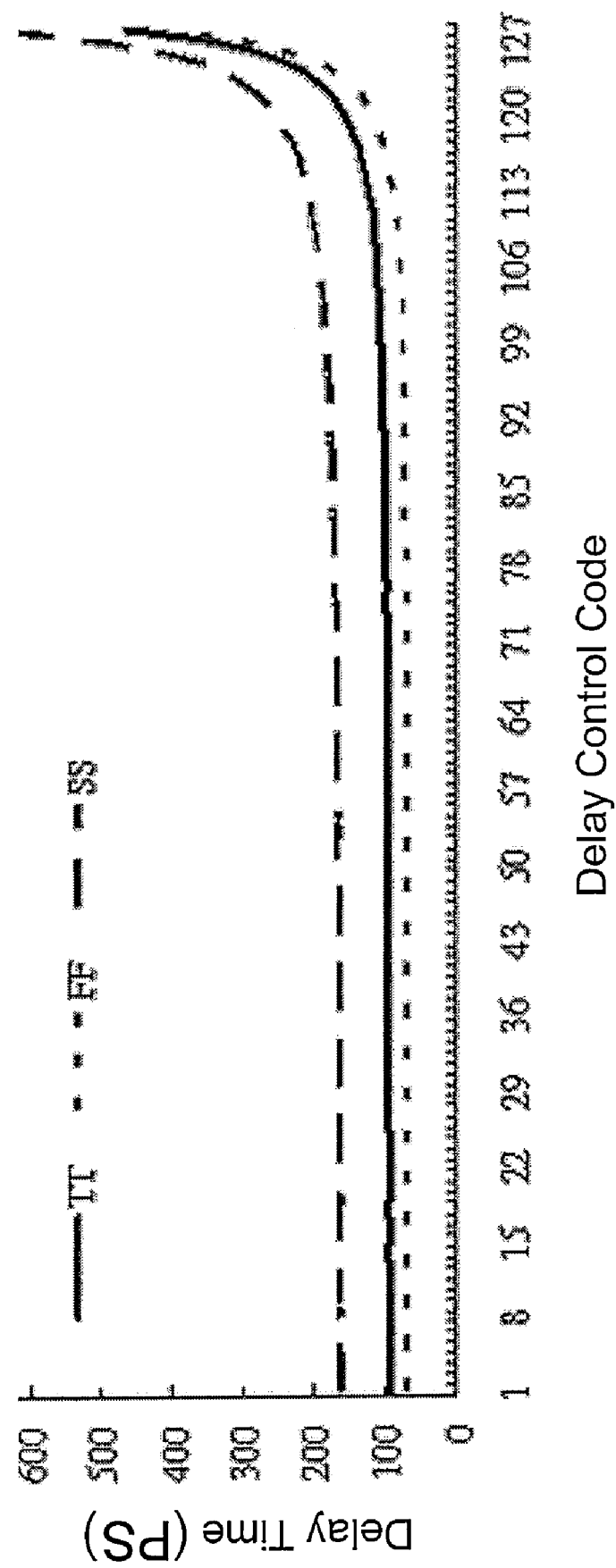
FIG. 4 is a simulation diagram of the conventional programmable delay circuit 300.
Figure 5:
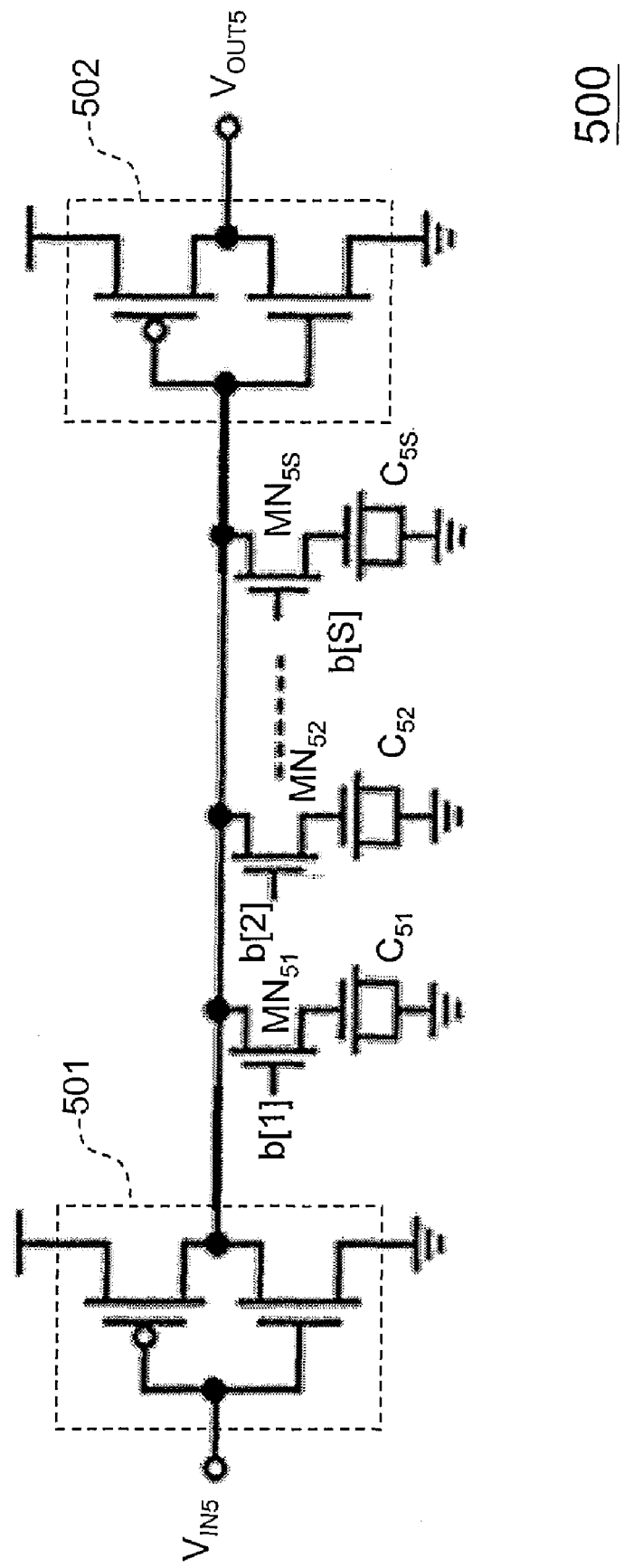
FIG. 5 is a schematic structural view of still another conventional programmable delay circuit.
Figure 6:
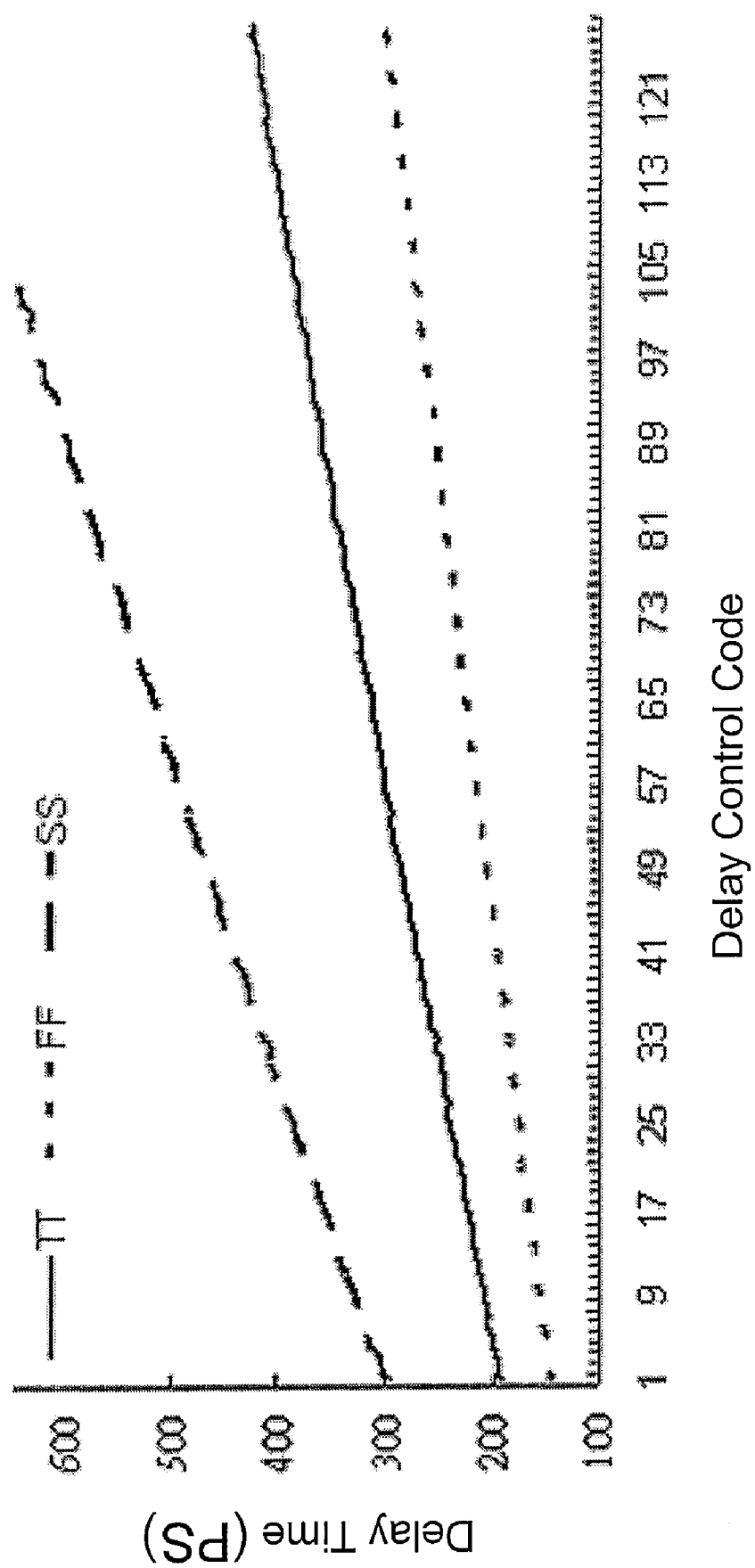
FIG. 6 is a simulation diagram of the conventional programmable delay circuit 500.
Figure 7:
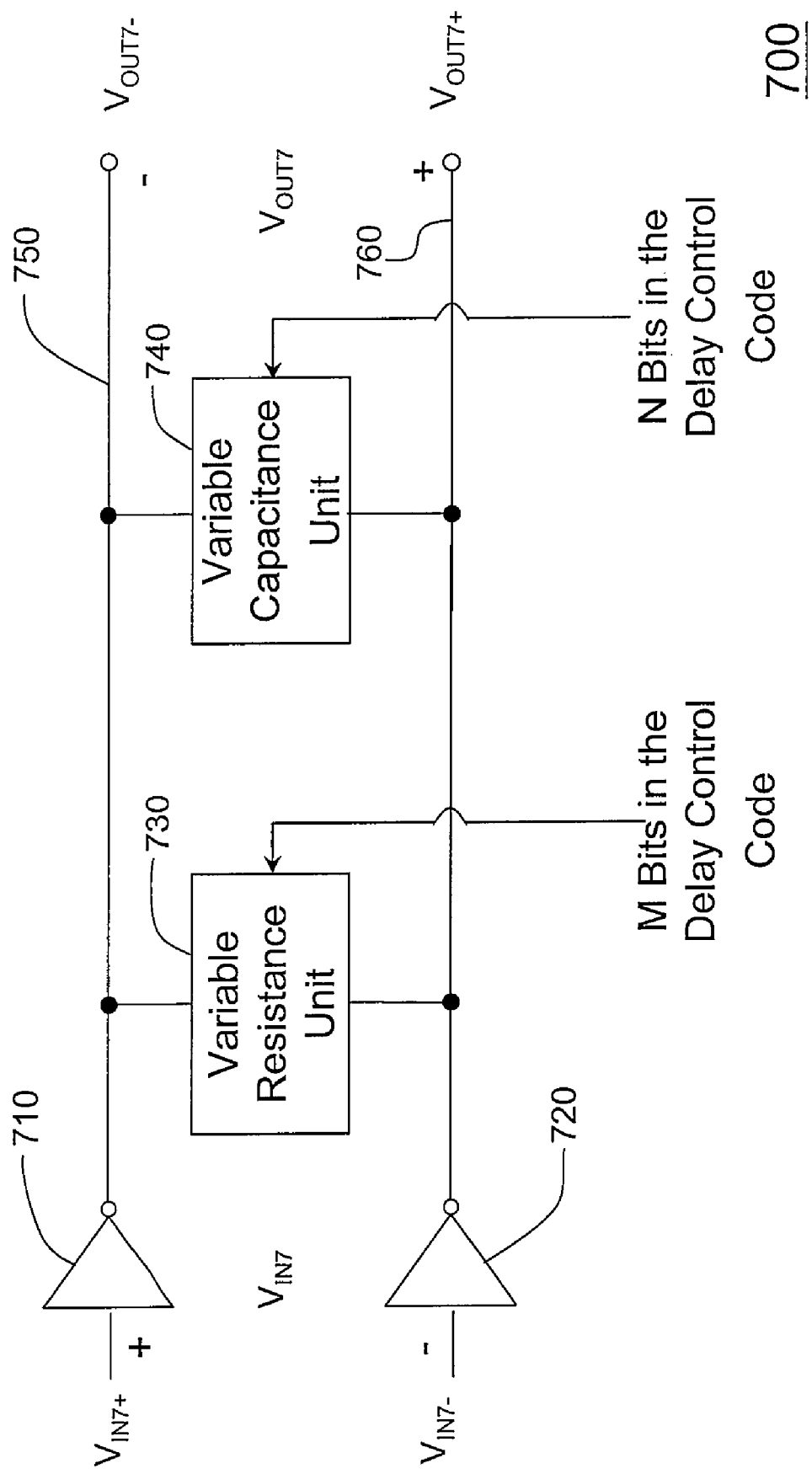
FIG. 7 is an architectural view of a programmable delay circuit according to an embodiment of the present invention.

FIG. 7 is an architectural view of a programmable delay circuit according to an embodiment of the present invention. The programmable delay circuit 700 includes inverters 710 and 720, a variable resistance unit 730, and a variable capacitance unit 740. Output ends of the inverters 710 and 720 are coupled to an anti-phase output signal line 750 and a positive-phase output signal line 760 respectively, and the variable resistance unit 730 and the variable capacitance unit 740 are coupled between the anti-phase output signal line 750 and the positive-phase output signal line 760.

Referring to FIG. 7, the programmable delay circuit 700 employs a double-ended design, so a received differential signal $V_{IN7}$ received by the programmable delay circuit 700 includes a positive-phase received signal $V_{IN7+}$ and an anti-phase received signal $V_{IN7-}$, and a differential output signal $V_{OUT7}$ output by the programmable delay circuit 700 includes a positive-phase output signal $V_{OUT7+}$ and an anti-phase output signal $V_{OUT7-}$. Here, an input end of the inverter 710 receives the positive-phase received signal $V_{IN7+}$, such that the anti-phase output signal line 750 transmits the anti-phase output signal $V_{OUT7-}$. Similarly, an input end of the inverter 720 receives the anti-phase received signal $V_{IN7-}$, such that the positive-phase output signal line 760 transmits the positive-phase output signal $V_{OUT7+}$.

On the other hand, the variable resistance unit 730 and the variable capacitance unit 740 enable the programmable delay circuit 700 to regulate the delay time between the received differential signal $V_{IN7}$ and the differential output signal $V_{OUT7}$ according to a delay-controlled code. The variable resistance unit 730 regulates the equivalent resistance between the anti-phase output signal line 750 and the positive-phase output signal line 760 according to M bits in the delay-controlled code, and the variable capacitance unit 740 regulates the equivalent capacitance between the anti-phase output signal line 750 and the positive-phase output signal line 760 according to N bits in the delay-controlled code. Here, M and N are positive integers.

The details about the reason why the delay time can be changed by regulating the equivalent resistance and the equivalent capacitance between the anti-phase output signal line 750 and the positive-phase output signal line 760 will be illustrated below to describe the operating mechanism of this example.

Figure 8:
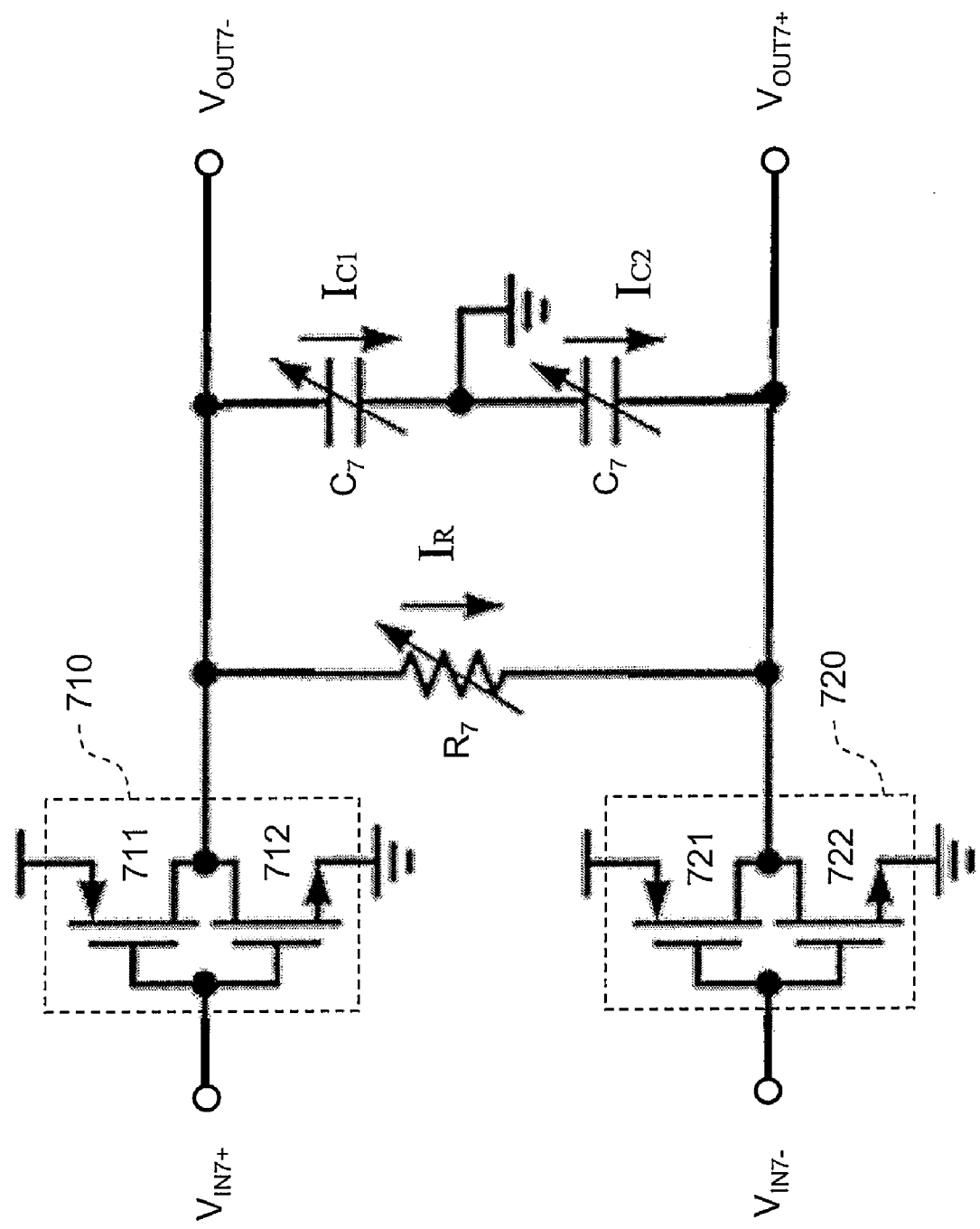
FIG. 8 shows an equivalent model of the programmable delay circuit 700.

FIG. 8 shows an equivalent model of the programmable delay circuit 700. For the convenience of illustration, inverters constituted of PMOS transistors and NMOS transistors are taken as the example. Referring to FIG. 8, the inverter 710 comprises a PMOS transistor 711 and an NMOS transistor 712, and the inverter 720 comprises a PMOS transistor 721 and an NMOS transistor 722. In addition, a variable resistor $R_7$ represents the equivalent resistance of the variable resistance unit 730, two variable capacitors $C_7$ represent the equivalent capacitance of the variable capacitance unit 740, $I_R$ represents a current flowing through the variable resistor $R_7$, and $I_{C1}$ and $I_{C2}$ represent currents flowing through two variable capacitors $C_7$ respectively.

Figure 9:
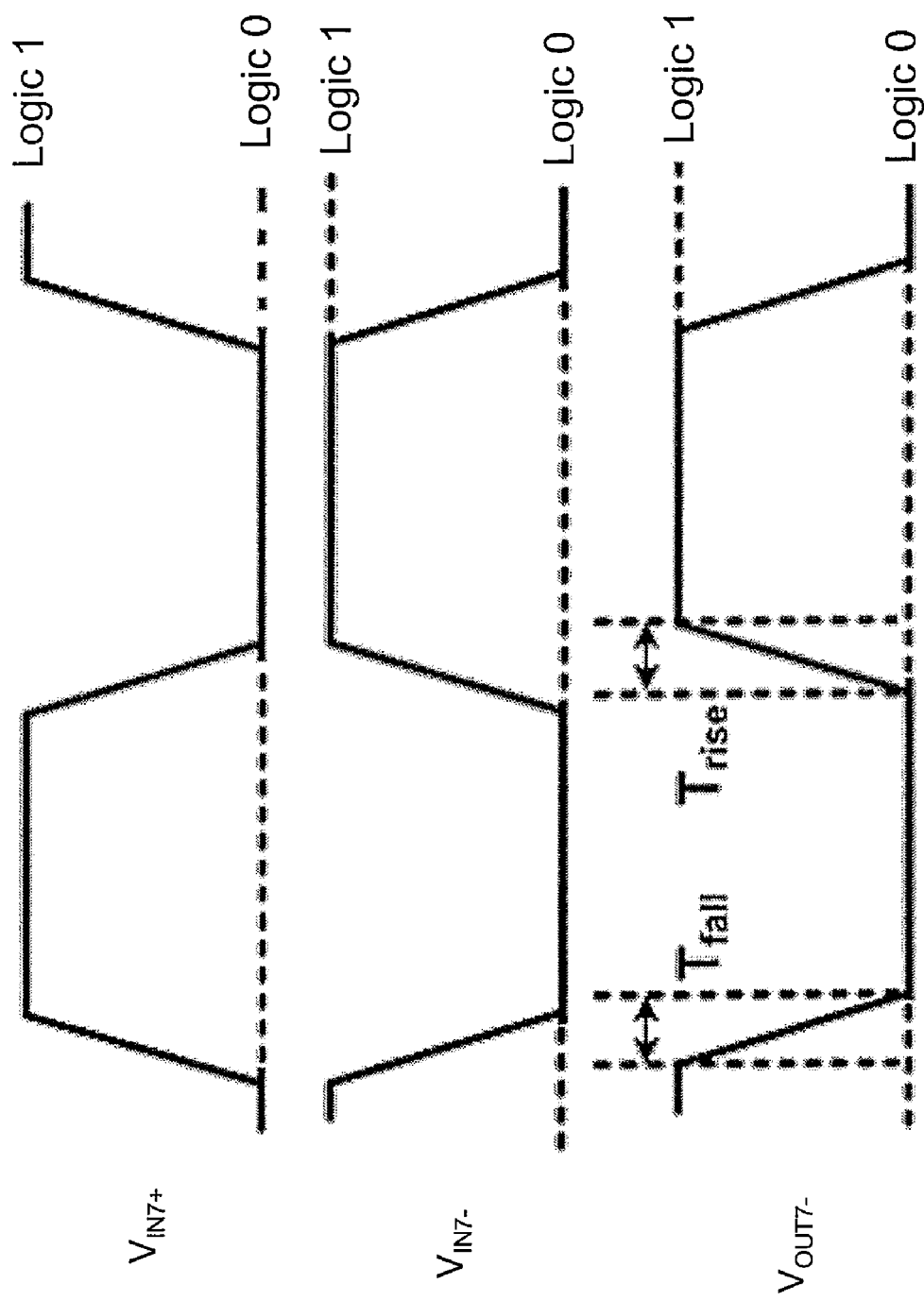
FIG. 9 is a timing diagram of the received differential signal $V_{IND7}$ and the anti-phase output signal $V_{OUT7}^-$.
Figure 10:
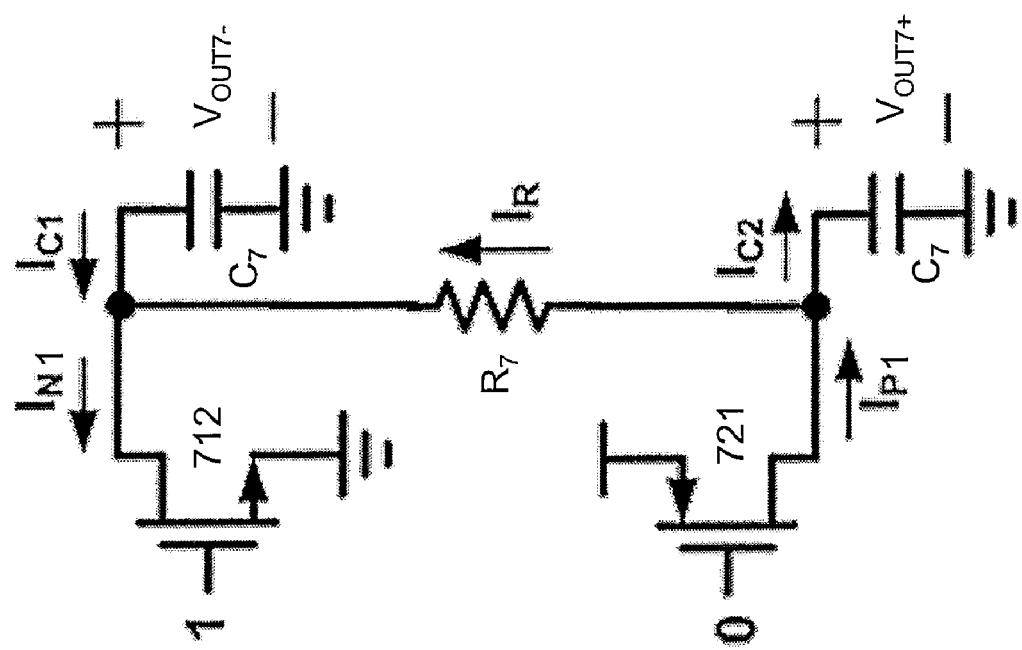
FIG. 10 shows another equivalent model to illustrate FIG. 8.

FIG. 9 is a timing diagram of the received received differential signal $V_{IN7}$ and the anti-phase output signal $V_{OUT7-}$. Referring to FIGS. 8 and 9 together, the operating mechanism of the programmable delay circuit 700 is illustrated. When the positive-phase received signal $V_{IN7+}$ is at a high level (e.g., logic 1), and the anti-phase received signal $V_{IN7-}$ is at a low level (e.g., logic 0), the NMOS transistor 712 and the PMOS transistor 721 are in an ON state, and the PMOS transistor 711 and the NMOS transistor 722 are in an OFF state. Here, the equivalent model of FIG. 8 can be simplified as shown in FIG. 10. Referring to FIG. 10, under such circumstance, the anti-phase output signal $V_{OUT7-}$ discharges to a ground end via the NMOS transistor 712, and the PMOS transistor 721 charges the variable capacitor $C_7$ to the positive-phase output signal $V_{OUT7+}$.

At this time, it is assumed that a current $I_{N1}$ flowing through the NMOS transistor 712 is equal to a current $I_{P1}$ flowing through the PMOS transistor 721, wherein $I_{N1}=I_{P1}$, according to the Kirchhoff's Current Law (KCL), the current $I_{C1}$ will be equal to the current $I_{C2}$ as well ($I_{C1}=I_{C2}$). Here, the PMOS transistor 721 and the NMOS transistor 712 are further represented by current sources $S_{71}$ and $S_{72}$ respectively, the currents $I_{N1}$ and $I_{P1}$ are replaced by a symbol I, and the currents $I_{C1}$ and $I_{C2}$ are replaced by a symbol $I_C$, then the equivalent model of FIG. 10 is simplified as shown in FIG. 11.

Similarly, when the positive-phase received signal $V_{IN7+}$ is at a low level (e.g., logic 0), and the anti-phase received signal $V_{IN7-}$ is at a high level (e.g., logic 1), the PMOS transistor 711 and the NMOS transistor 722 are in the ON state, and the NMOS transistor 712 and the PMOS transistor 721 are in the OFF state. At this time, the equivalent model of FIG. 8 can be simplified as shown in FIG. 12. Referring to FIG. 12, under such circumstance, the PMOS transistor 711 charges the variable capacitor $C_7$ to the positive-phase output signal $V_{OUT7+}$, and the anti-phase output signal $V_{OUT7-}$ discharges to the ground end via the NMOS transistor 722. It is assumed that the current $I_{P1}$ flowing through the PMOS transistor 711 is equal to the current $I_{N1}$ flowing through the NMOS transistor 722, wherein $I_{P1}=I_{N1}$, according to the Kirchhoff's Current Law (KCL), the current $I_{C1}$ will be equal to the current $I_{C2}$ as well ($I_{C1}=I_{C2}$). Here, the PMOS transistor 711 and the NMOS transistor 722 are further represented by current sources $S_{71}$ and $S_{72}$ respectively, the currents $I_{N1}$ and $I_{P1}$ are replaced by the symbol I, and the currents $I_{C1}$ and $I_{C2}$ are replaced by the symbol $I_C$, then the equivalent model of FIG. 12 is simplified as shown in FIG. 11.

Figure 11:
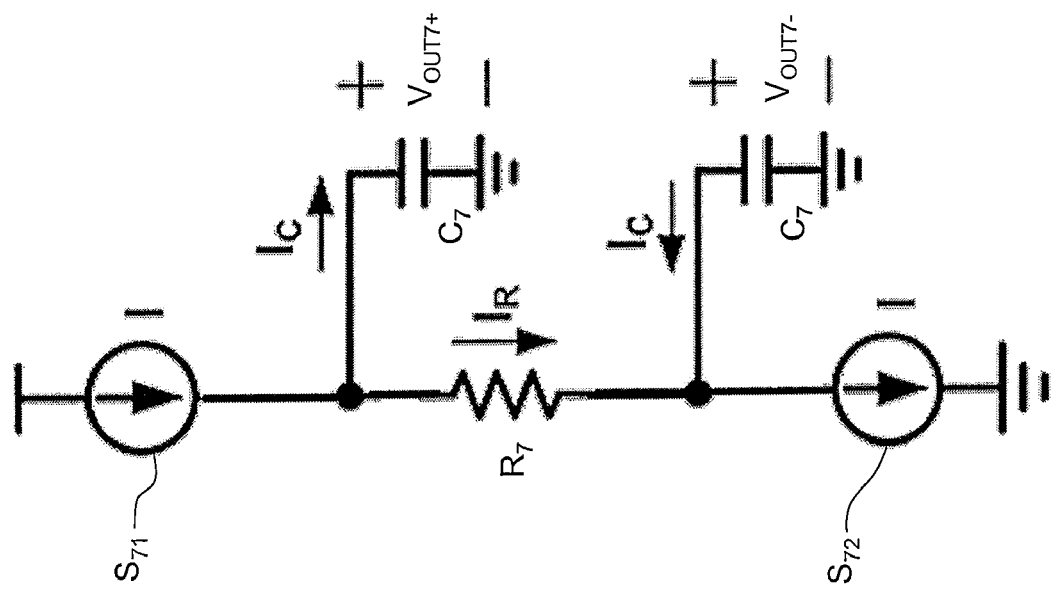
FIG. 11 shows a simple charging-discharging model of the programmable delay circuit 700.
Figure 12:
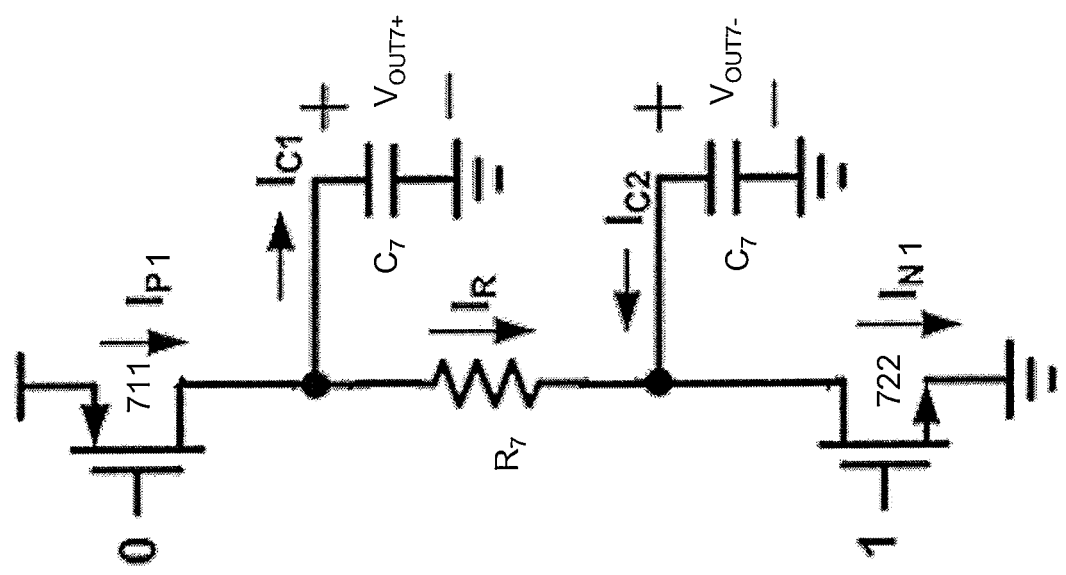
FIG. 12 shows still another equivalent model to illustrate FIG. 8.

With reference to the simple charging-discharging model of FIG. 11, a rise time $T_{rise}$ and fall time $T_{fall}$ of the anti-phase output signal $V_{OUT7-}$ is calculated (as shown in FIG. 9). Formula (1) is a relationship formula of the capacitor $C_7$ to the voltage and current:

$$I_C = C_7 \frac{\Delta Vo}{\Delta T} \quad (1)$$

where $\Delta Vo$ denotes a voltage variation of $V_{OUT7+}$ or $V_{OUT7-}$, and $\Delta T$ denotes the charging/discharging time of the capacitor $C_7$. Its can be seen from FIG. 11 that the current source $S_{71}$ charges the variable capacitor $C_7$ with the current $I_C=I-I_R$. Similarly, the variable capacitor $C_7$ discharges to the ground end with the current $I_C=I-I_R$. The above relationship formulae are taken into Formula (1), and the following Formula (2) and Formula (3) are obtained respectively.

$$I - I_R = I_C = C_7 \frac{\Delta Vo}{T_{rise}} \quad (2)$$

$$I_R - I = I_C = C_7 \frac{\Delta Vo}{T_{fall}} \quad (3)$$

As the currents I provided by the current sources $S_{71}$ and $S_{72}$ are approximate to the current $I_R$, Formula (2) and Formula (3) can be regarded as two equal mathematical formulae. After the above two formulae can be simplified and expressed as follows:

$$\Delta T = T_{rise} = T_{fall} = C_7 \frac{\Delta Vo}{I_C} \quad (4)$$

According to the above analysis, it can be deduced from Formula (2) and Formula (3) that the rise time $T_{rise}$ and the fall time $T_{fall}$ will be regulated by the current $I_R$ and the variable capacitor $C_7$ respectively. The rise time $T_{rise}$ and the fall time $T_{fall}$ increases as the current $I_R$ becomes greater, and also increases as the capacitance value of the capacitor $C_7$ becomes greater. In addition, it can be deduced from Formula (4) that the rise time $T_{rise}$ is equal to the fall time $T_{fall}$.

Figure 13:
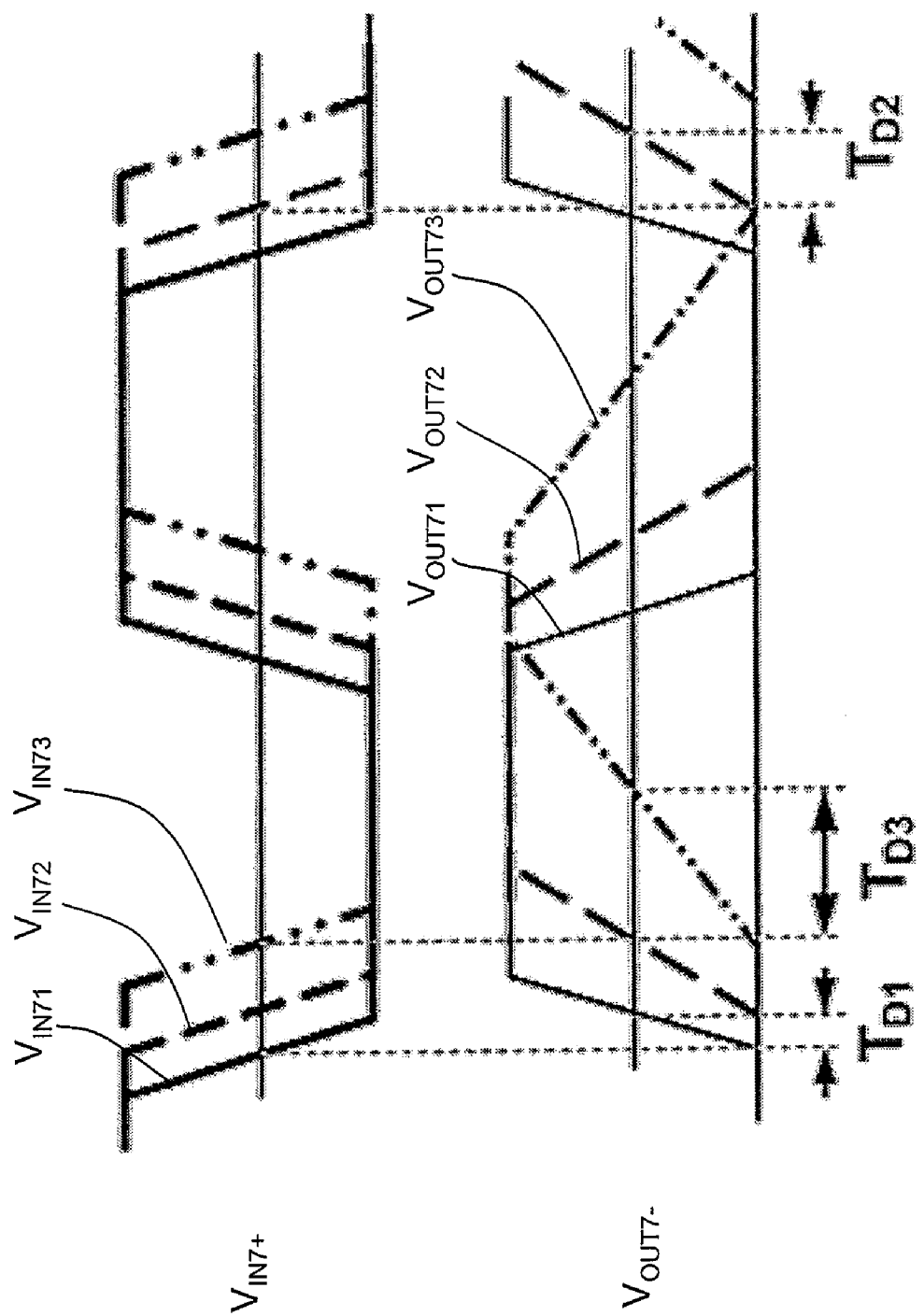
FIG. 13 is a timing diagram of the positive-phase received signal $V_{IN7+}$ and the anti-phase output signal $V_{OUT7-}$.

In addition, FIG. 13 is a timing diagram of the positive-phase received signal $V_{IN7+}$ and the anti-phase output signal $V_{OUT7-}$, wherein $V_{IN71}$-$V_{IN73}$ represent the positive-phase received signal $V_{IN7+}$ received by the inverters 710 and 720 at different time points respectively. Under the regulation of the current $I_R$ and the variable capacitor $C_7$, $V_{IN71}$-$V_{IN73}$ corresponds to the anti-phase output signals $V_{OUT71}$-$V_{OUT73}$ having different rise time $T_{rise}$ and fall time $T_{fall}$ respectively. Referring to FIG. 13, it can be deduced that the rise time $T_{rise}$ and the fall time $T_{fall}$ are directly proportional to the delay time. For example, the corresponding rise time $T_{rise}$ and fall time $T_{fall}$ of the delay time $T_{D1}$ are the shortest, the corresponding rise time $T_{rise}$ and fall time $T_{fall}$ of the delay time $T_{D2}$ are the second shortest, and the corresponding rise time $T_{rise}$ and fall time $T_{fall}$ of the delay time $T_{D3}$ is the longest.

To sum up, it can be deduced from the conclusion obtained from the simple charging-discharging model of FIG. 11 and the timing diagram of FIG. 13 that the rise time $T_{rise}$ and the fall time $T_{fall}$ are regulated by the current $I_R$ and the variable capacitor $C_7$ respectively, and the delay time is directly proportional to the rise time $T_{rise}$ and the fall time $T_{fall}$. Therefore, when the variable resistance unit 730 changes the equivalent resistance between the anti-phase output signal line 750 and the positive-phase output signal line 760, or when the variable capacitance unit 740 changes the equivalent capacitance between the anti-phase output signal line 750 and the positive-phase output signal line 760, the delay time between the received differential signal $V_{IN7}$ and the differential output signal $V_{OUT7}$ will be regulated accordingly.

Figure 14:
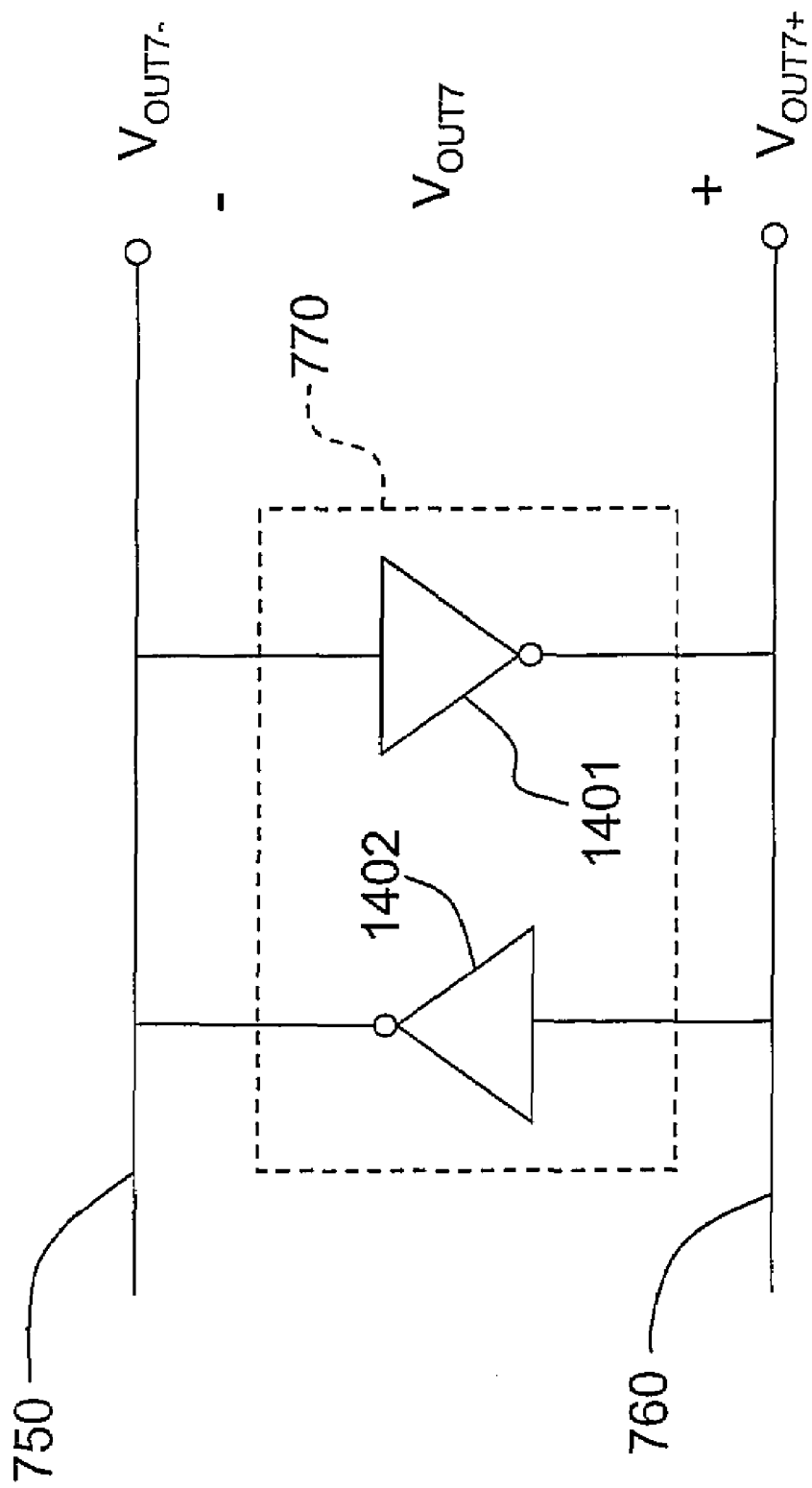
FIG. 14 is a schematic structural view of the phase clamping unit.

FIG. 14 is a schematic structural view of a phase clamping unit. Referring to FIG. 14, the programmable delay circuit 700 further includes a phase clamping unit 770. The phase clamping unit 770 includes inverters 1401 and 1402. An input end of the inverter 1401 is coupled to the anti-phase output signal line 750, and an output end of the inverter 1401 is coupled to the positive-phase output signal line 760. An input end of the inverter 1402 is coupled to the positive-phase output signal line 760, and an output end of the inverter 1402 is coupled to the anti-phase output signal line 750. The programmable delay circuit 700 uses the phase clamping unit 770 to make the positive-phase output signal $V_{OUT7+}$ and the anti-phase output signal $V_{OUT7-}$ have opposite phases.

Figure 15:
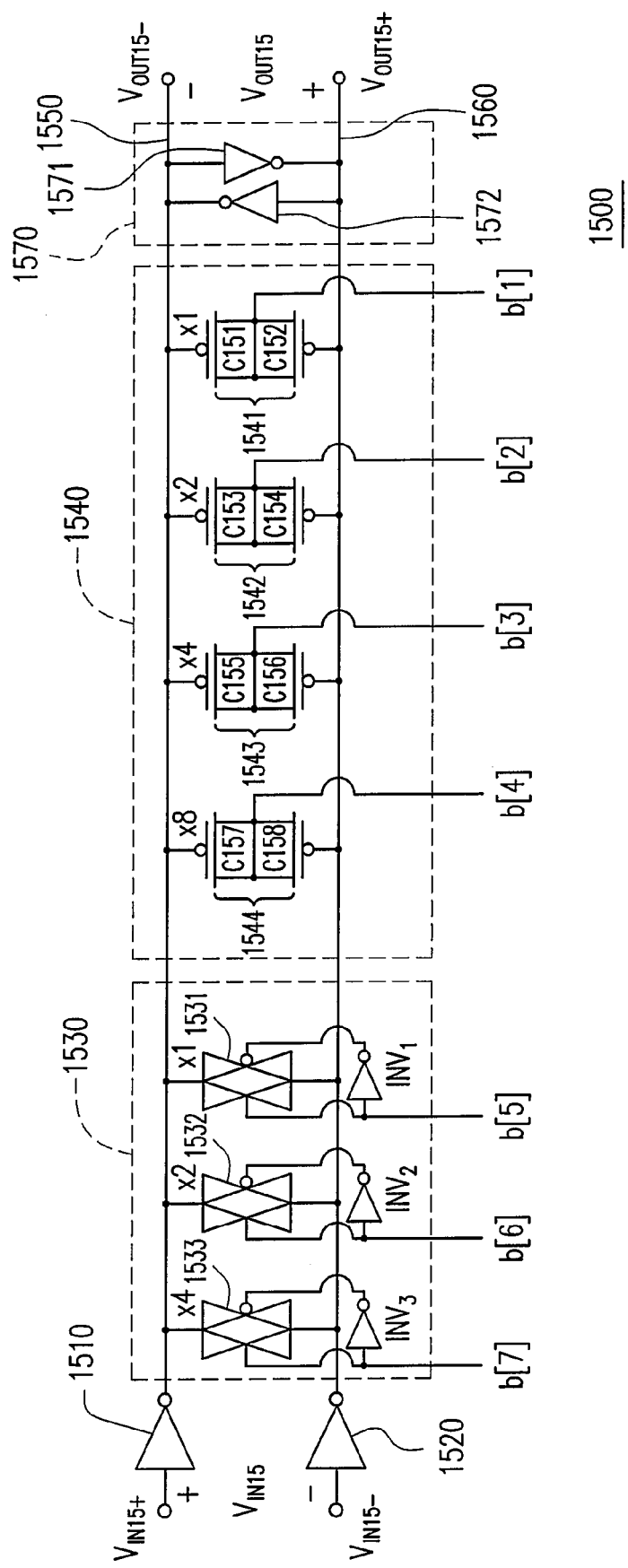
FIG. 15 is a detailed circuit diagram of a programmable delay circuit according to an embodiment of the present invention.

FIG. 15 is a detailed circuit diagram of a programmable delay circuit according to an embodiment of the present invention. Referring to FIG. 15, a programmable delay circuit 1500 includes inverters 1510 and 1520, a variable resistance unit 1530, a variable capacitance unit 1540, and a phase clamping unit 1570. The circuit architecture and operating mechanism of the programmable delay circuit 1500 are similar to those of the programmable delay circuit 700, so the detailed description of coupling manner and circuit functions of the inverters 1510 and 1520, the variable resistance unit 1530, the variable capacitance unit 1540, and the phase clamping unit 1570 will not be repeated herein again, and the circuit architecture of each sub-block of the programmable delay circuit 1500 will be explained in detail below.

Before the sub-blocks being explained, defining the delay-controlled code received by the programmable delay circuit 1500 firstly. The resolution of the delay-controlled code is (M+N) bits. Here, the $(M+N)^{th}$ bit to the $1^{st}$ bit included in the delay-controlled code are represented as b[M+N:1], and b[x] represents the $x^{th}$ bit in the delay-controlled code, in which x is an integer, and $1 \leq x \leq (M+N)$. Accordingly, b[1]-b[N] are a set of less significant bits, and b[N+1]-b[M+N] are a set of more significant bits, b[1] is the least significant bit, and b[M+N] is the most significant bit. In the programmable delay circuit 1500 below, M=3 and N=4.

Referring to FIG. 15 again, the variable resistance unit 1530 includes transmission gates 1531-1533 and inverters $INV_1$-$INV_3$. First terminals of the transmission gates 1531-1533 are coupled to the anti-phase output signal line 1550, and second terminals of the transmission gates 1531-1533 are coupled to the positive-phase output signal line 1560. An input end of the inverter $INV_1$ is coupled to the first gate of the transmission gate 1531, and an output end of the inverter $INV_1$ is coupled to the second gate of the transmission gate 1531. An input end of the inverter $INV_2$ is coupled to the first gate of the transmission gate 1532, and an output end of the inverter $INV_2$ is coupled to the second gate of the transmission gate 1532. The coupling manner of the inverter $INV_3$ can be derived from the above description.

The variable resistance unit 1530 regulates the equivalent resistance between the anti-phase output signal line 1550 and the positive-phase output signal line 1560 according to the conductive state of the transmission gates 1531 - 1533. The conductive state of the transmission gate 1531 is controlled by the b[5] through the inverter $INV_1$. Similarly, the conductive states of the transmission gates 1532 and 1533 are controlled by b[6] and b[7] through the inverters $INV_2$ and $INV_3$ respectively. Thus, the variable resistance unit 1530 regulates the equivalent resistance between the anti-phase output signal 1550 and the positive-phase output signal line 1560 according to 3 bits b[7:5] in the delay-controlled code.

It should be noted that the variable resistance unit 1530 increases the device sizes of the transmission gates 1532 and 1532 by a power of 2 on the basis of the device size of the transmission gate 1531.

In another aspect, the variable capacitance unit 1540 can include variable capacitors 1541-1544. A first terminal of the variable capacitor 1541 is coupled to the anti-phase output signal line 1550, and a second terminal of the variable capacitor 1541 is coupled to the positive-phase output signal line 1560. In addition, the first terminal of the variable capacitor 1542 is coupled to the anti-phase output signal line 1550, and the second terminal of the variable capacitor 1542 is coupled to the positive-phase output signal line 1560. The coupling mode of the variable capacitors 1543 and 1544 can be derived from the above description.

Furthermore, each of the variable capacitors 1541-1544 includes 2 capacitors. For example, the variable capacitor 1541 includes capacitors C151 and C152. The first end of the capacitor C151 is coupled to the anti-phase output signal line 1550, the second end of the capacitor C151 is coupled to the first end of the capacitor C152, and the second end of the capacitor C152 is coupled to the positive-phase output signal line 1560. Similarly, the variable capacitor 1542 includes capacitors C153 and C154. The first end of the capacitor C153 is coupled to the anti-phase output signal line 1550, the second end of the capacitor C153 is coupled to a first end of the capacitor C154, and the second end of the capacitor C154 is coupled to the positive-phase output signal line 1560. The components and coupling manner of the variable capacitors 1543 and 1544 can be derived from the above description.

The variable capacitance unit 1540 regulates the equivalent capacitance between the anti-phase output signal line 1550 and the positive-phase output signal line 1560 by changing the capacitance of the variable capacitors 1541-1544. The capacitance of the variable capacitor 1541 is controlled the b[1]. Similarly, the capacitance of the variable capacitors 1542-1544 is controlled by the bits b[2]-b[4] respectively. Thus, the variable capacitance unit 1540 regulates the equivalent capacitance between the anti-phase output signal 1550 and the positive-phase output signal line 1560 according to 4 bits b[4:1] in the delay-controlled code.

It should be noted that the variable capacitance unit 1540 increases the capacitance values of the variable capacitors 1542-1544 by a power of 2 on the basis of the device size of the variable capacitor 1541. For example, if the capacitance value of the variable capacitor 1541 is 0.2 farad, then the capacitance value of the variable capacitor 1542 is 0.4 farad, the capacitance value of the variable capacitor 1543 is 0.8 farad and the capacitance value of the variable capacitor 1544 is 1.6 farad. In addition, each of the capacitors C151-C158 constituting the variable capacitors 1541-1544 is a PMOS capacitor.

Moreover, the phase clamping unit 1570 includes inverters 1571 and 1572. An input end of the inverter 1571 is coupled to the anti-phase output signal line 1550, and an output end of the inverter 1571 is coupled to the positive-phase output signal line 1560. An input end of the inverter 1572 is coupled to the positive-phase output signal line 1560, and an output end of the inverter 1572 is coupled to the anti-phase output signal line 1550. The programmable delay circuit 1500 uses the phase clamping unit 1570 to make the positive-phase output signal $V_{OUT15+}$ and the anti-phase output signal $V_{OUT15-}$ have opposite phases.

Figure 16:
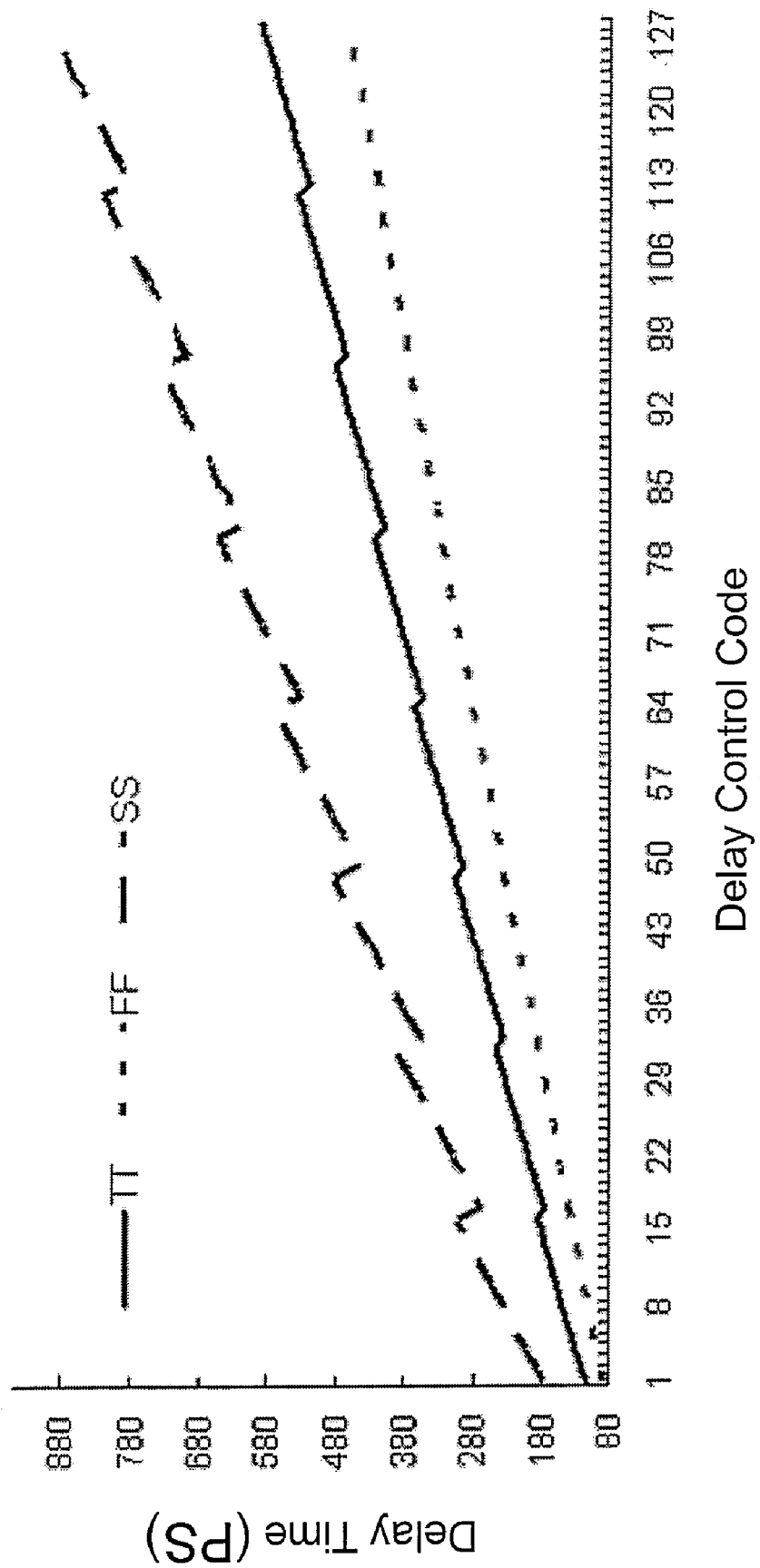
FIG. 16 is a simulation diagram of the programmable delay circuit 1500.

To make the circuit characteristic of the programmable delay circuit 1500 apparent, FIG. 16 shows a simulation diagram of the programmable delay circuit 1500, wherein TT, FF, SS are simulation models in the process technology applied in this embodiment. Here, different simulation models correspond to different process variations. Referring to FIG. 16, it can be determined that in the characteristic curve of the delay-controlled code to the delay time, the delay time controlled by the programmable delay circuit 1500 has fine linearity and a wide range of corner overlap.

It should be noted that the programmable delay circuit 1500 employs the double-ended design, so the delay time generated by the programmable delay circuit 1500 is more stable compared to the conventional delay circuits employing a single-ended design. In addition, in the programmable delay circuit 1500, if the maximum delay time that can be regulated by the variable capacitance unit 1540 is adjusted to be greater than the minimum delay time that can be regulated by the variable resistance unit 1530, the problem of discontinuous delay time can be resolved and thereby achieve an optimal design.

To sum up, the present invention regulates the delay time between the received differential signal and the differential output signal by changing the equivalent resistance of the variable resistance unit and the equivalent capacitance of the variable capacitance unit.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A programmable delay circuit, for delaying a received differential signal according to a delay-controlled code to obtain a differential output signal, wherein the received differential signal comprises a positive-phase received signal and an anti-phase received signal, and the differential output signal comprises a positive-phase output signal and an anti-phase output signal, and wherein a resolution of the delay-controlled code comprises (M+N) bits, and M and N are integers, the programmable delay circuit comprising:
   a first inverter, comprising an input end for receiving the positive-phase received signal and an output end coupled to an anti-phase output signal line;
   a second inverter, comprising an input end for receiving the anti-phase received signal and an output end coupled to a positive-phase output signal line;
   a variable resistance unit, coupled between the anti-phase output signal line and the positive-phase output signal line, for regulating an equivalent resistance between the anti-phase output signal line and the positive-phase output signal line according to M bits in the delay-controlled code; and
   a variable capacitance unit, coupled between the anti-phase output signal line and the positive-phase output signal line, for regulating an equivalent capacitance between the anti-phase output signal line and the positive-phase output signal line according to N bits in the delay-controlled code,
   wherein the anti-phase output signal is obtained from the anti-phase output signal line, and the positive-phase output signal is obtained from the positive-phase output signal line.

2. The programmable delay circuit as claimed in claim 1, further comprising:
   a phase clamping unit, coupled between the anti-phase output signal line and the positive-phase output signal line, for making the positive-phase output signal and the anti-phase output signal have opposite phases.

3. The programmable delay circuit as claimed in claim 2, wherein the phase clamping unit comprises:
   a third inverter, having an input end coupled to the anti-phase output signal line and an output end coupled to the positive-phase output signal line; and
   a fourth inverter, having an input end coupled to the positive-phase output signal line and an output end coupled to the anti-phase output signal line.

4. The programmable delay circuit as claimed in claim 1, wherein the $x^{th}$ bit in the delay-controlled code is b[x], b[1]~b[N] is a set of less significant bits, b[N+1]~b[M+N] is a set of more significant bits, b[1] is a least significant bit, b[M+N] is the most significant bit, and wherein X is an integer, and $1 \leq x \leq (M+N)$.

5. The programmable delay circuit as claimed in claim 4, wherein the variable resistance unit comprises:
   M transmission gates, wherein each of the transmission gates has a first gate, a second gate, a first terminal, and a second terminal, wherein the first terminal of each of the transmission gates is coupled to the anti-phase output signal line, and the second terminal of each of the transmission gates is coupled to the positive-phase output signal line; and
   M inverters, wherein an input end of an $i^{th}$ inverter is coupled to the first gate of the $i^{th}$ transmission gate for receiving the b[i+N], an output end of the $i^{th}$ inverter is coupled to the second gate of the $i^{th}$ transmission gate, wherein i is a positive integer, and $1 \leq i \leq M$.

6. The programmable delay circuit as claimed in claim 5, wherein sizes of the $2^{nd}$ to the $M^{th}$ transmission gates increased by a power of 2 on a basis of a size of the $1^{st}$ transmission gate.

7. The programmable delay circuit as claimed in claim 4, wherein the variable capacitance unit comprises:
   N variable capacitors, wherein each of the variable capacitors has a first terminal, a second terminal and a control end, the first terminal of each of the variable capacitors is coupled to the anti-phase output signal line, the second terminal of each of the variable capacitors is coupled to the positive-phase output signal line, and the control end of the $j^{th}$ variable capacitor receives the b[j], wherein j is an integer, and $1 \leq j \leq N$.

8. The programmable delay circuit as claimed in claim 7, wherein the $j^{th}$ variable capacitor comprises:
   a first capacitor, having a first end coupled to the anti-phase output signal line and a second end receiving the b[j]; and
   a second capacitor, having a first end coupled to the second end of the first capacitor and a second end coupled to the positive-phase output signal line.

9. The programmable delay circuit as claimed in claim 8, wherein the first capacitor and the second capacitor comprise PMOS capacitors.

10. The programmable delay circuit as claimed in claim 7, wherein the capacitance values of the $2^{nd}$ to the $N^{th}$ variable capacitors increased by a power of 2 on a basis of a size of the $1^{st}$ variable capacitor.

11. A programmable delay circuit, for delaying a received differential signal according to a delay-controlled code to obtain a differential output signal, wherein the received differential signal comprises a positive-phase received signal and an anti-phase received signal, and the differential output signal comprises a positive-phase output signal and an anti-phase output signal, and wherein a resolution of the delay-controlled code comprises (M+N) bits, and M and N are integers, the programmable delay circuit comprising:
   a first inverter, comprising an input end for receiving the positive-phase received signal;
   a second inverter, comprising an input end for receiving the anti-phase received signal;
   a plurality of variable resistance devices, each of the variable resistance devices respectively coupled between the output end of the first inverter and the output end of the second inverter, for regulating an equivalent resistance between the output ends of the first inverter and the second inverter according to M bits in the delay-controlled code; and a plurality of variable capacitance devices, coupled between the output ends of the first inverter and the second inverter, for regulating an equivalent capacitance between the output ends of the first inverter and the second inverter according to N bits in the delay-controlled code;

wherein the anti-phase output signal is obtained from the output end of the first inverter, and the positive-phase output signal is obtained from the output end of the second inverter.

12. The programmable delay circuit as claimed in claim 11, further comprising:

a phase clamping unit, coupled between the output end of the first inverter and the output end of the second inverter, for making the positive-phase output signal and the anti-phase output signal have opposite phases.

13. The programmable delay circuit as claimed in claim 12, wherein the phase clamping unit comprises:

a third inverter, having an input end coupled to the output end of the first inverter and an output end coupled to the output end of the second inverter; and a fourth inverter, having an input end coupled to the output end of the second inverter and an output end coupled to the output end of the first inverter.

14. The programmable delay circuit as claimed in claim 11, wherein an $x^{th}$ bit in the delay-controlled code is b[x], b[1]~b[N] is a set of less significant bits, b[N+1]~b[M+N] is a set of more significant bits, b[1] is a least significant bit, b[M+N] is a most significant bit, wherein X is an integer, and $1 \leq x \leq (M+N)$.

15. The programmable delay circuit as claimed in claim 14, wherein each of the variable resistance devices comprises:

a transmission gate, having a first gate, a second gate, a first terminal, and a second terminal, wherein the first terminal of the transmission gate is coupled to the output end of the first inverter, and the second terminal of the transmission gate is coupled to the output end of the second inverter; and a fifth inverter, having an input end coupled to the first gate of the transmission gate for receiving one of the bits b[N+1]-b[M+N], and an output end coupled to the second gate of the transmission gate.

16. The programmable delay circuit as claimed in claim 14, wherein each of the variable capacitance devices comprises:

a first capacitor, having a first end coupled to the output end of the first inverter and a second end for receiving one of the bits b[1]-b[N]; and a second capacitor, having a first end coupled to the second end of the first capacitor and a second end coupled to the output end of the second inverter.

17. The programmable delay circuit as claimed in claim 11, wherein the resistance values of the variable resistance devices increased by a power of 2.

18. The programmable delay circuit as claimed in claim 11, wherein the capacitance values of the variable capacitance devices increased by a power of 2.

* * * * *